US007473321B2

(12) United States Patent
Koga et al.

(10) Patent No.: US 7,473,321 B2
(45) Date of Patent: Jan. 6, 2009

(54) LASER TREATMENT APPARATUS

(75) Inventors: Norihisa Koga, Koshi-Machi (JP); Shinji Koga, Koshi-Machi (JP); Naoto Yoshitaka, Koshi-Machi (JP); Akira Nishiya, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 132 days.

(21) Appl. No.: 11/213,705

(22) Filed: Aug. 30, 2005

(65) Prior Publication Data

US 2006/0205239 A1 Sep. 14, 2006

(30) Foreign Application Priority Data

Aug. 31, 2004 (JP) ............................ 2004-253095

(51) Int. Cl.
*B05C 11/00* (2006.01)
*B05C 13/02* (2006.01)
*B05C 1/28* (2006.01)
*B05B 5/00* (2006.01)

(52) U.S. Cl. ....................... 118/663; 118/687; 118/326; 118/52; 118/500

(58) Field of Classification Search ................. 118/642, 118/52, 56, 612, 319, 320, 326, 643, 500, 118/305, 687, 688, 663, 695; 134/153, 198, 134/149; 156/345.5, 345.55, 345.11, 345.13; 219/121.6, 121.61, 121.8; 438/689; 396/611, 396/629, 604; 427/240, 425
See application file for complete search history.

(56) References Cited

U.S. PATENT DOCUMENTS

| | | | | |
|---|---|---|---|---|
| 6,000,862 | A * | 12/1999 | Okuda et al. | 396/579 |
| 6,715,943 | B2 * | 4/2004 | Nagamine | 396/611 |
| 2002/0050489 | A1 | 5/2002 | Ikegami et al. | |
| 2004/0197433 | A1 | 10/2004 | Terada et al. | |

* cited by examiner

*Primary Examiner*—Yewebdar T Tadesse
(74) *Attorney, Agent, or Firm*—Oblon, Spivak, McClelland, Maier & Neustadt, P.C.

(57) ABSTRACT

A drain port and an exhaust port arranged at the bottom of a cup surrounding a substrate holding unit. A drainage tray is arranged below the cup so as to cover the moving area of the drain port when the substrate holding unit and the cup move in X-directions and Y-directions. An exhaust unit is arranged at a position corresponding to the position of the exhaust port of the cup when the substrate holding unit is in its spin-drying position. The exhaust unit is connected to the exhaust port to suck the interior of the cup when the spin-drying of the substrate is executed. The use of a flexible tube which is always connected to the exhaust port is no longer necessary.

4 Claims, 9 Drawing Sheets

LASER TREATMENT APPARATUS

BACKGROUND OF THE INVENTION

1. Field of the Invention

The present invention relates to a laser treatment apparatus that irradiates a surface of a substrate with a laser beam, while a substrate holding unit moves horizontally and the surface of the substrate is supplied with a liquid, thereby to perform a laser treatment to the surface.

2. Description of the Related Art

As one of series of processes for fabricating a semiconductor device, a process is known, which process machines a substrate, such as a semiconductor wafer and a glass substrate for a liquid crystal display, by using a laser beam.

U.S. patent application publication No. 20020050489 A1 (Ikagami et al.) discloses a technique that scans a substrate surface by a laser beam to form dicing lines thereon. U.S. patent application publication No. 20040197433 A1 (Terada et al.) assigned to the same assignee of the present application discloses a technique that removes a resist film on an alignment mark formed on a substrate by using a laser beam in order to expose the alignment mark before exposure of the substrate. The use of a laser beam is effective for such treatments, because it has a high energy and can be positioned precisely.

When machining a substrate surface by using a laser beam, a substrate surface is irradiated with a laser beam while a liquid such as deionized water flows on the substrate surface, in order to prevent re-adhesion of substances removed by the machining to the substrate surface.

FIG. 11 schematically shows the structure of the laser machining apparatus of US 20040197433 A1. A chuck 13, which is capable of rotating by means of a drive mechanism 12, is arranged in a cup 11. A substrate 10 held by the chuck 13 is irradiated with a laser beam by means of a laser beam irradiating unit 14 while the chuck is moved in X- or Y-directions by means of a moving mechanism, thereby a resist film overlying an alignment mark is removed.

When irradiating a laser beam, a plate 15 made of a transparent quartz glass is placed such that it is slightly removed away from a surface of the substrate 10, and deionized water is supplied into a gap between the plate 15 and the substrate 10 from one side while the deionized water is sucked from the other side to be collected. After completion of the treatment by the laser beam, the plate 15 is raised, and a spin-drying, which removes the deionized water on the substrate 10 by rotating it, is performed.

During the irradiation of the laser beam, an amount of deionized water which can not be sucked is spilled from the wafer to fall into the cup 11. If the irradiated position is near the periphery of the substrate 10, a large amount of deionized water falls into the cup 11. When spin-dying the substrate 10, deionized water also scattered into the cup 11. Thus, the cup 11 must be provided in its bottom with a drain port to discharge the deionized water from the cup 11. Moreover, in order to prevent water droplets scattered during the spin-drying of the substrate 10 from going out of the cup 11, the cup 11 must be provided in its bottom with an exhaust port to form an air flow that draws the water droplets into the bottom of the cup 11. In the laser machining apparatus of US 20040197433 A1 is provided with an exhaust port 16 which is commonly used as the aforementioned drain port and exhaust port.

As the cup 11 moves X- and Y-directions by means of the moving mechanism, a flexible hose (exhaust pipe) long enough to adapt the moving range of the cup 11 must be connected to the cup 11. As the cost of a clean room per unit area is very high, semiconductor fabricating apparatuses are downsized, and component parts of the apparatuses including driving mechanisms are arranged in bottom spaces of the apparatuses in a high density. Thus, making a sufficiently wide space for the hose is difficult, in other words, prevents downsizing of the apparatus.

In addition, as a semiconductor fabricating apparatus has a number of driving mechanisms, it is preferable to use a possible smallest drive source for each driving mechanism. However, the curved flexible hose connected to the cup 11 offers a great resistance to the movement of a stage to which the cup 11 is mounted. In order to move the stage at a high speed and a high acceleration to ensure a high throughput of the apparatus, a high-power, thus large-sized drive source must be used. This problem becomes more noticeable in recent days when the size of a substrate (in a case of a semiconductor wafer, 12-inch size) becomes larger.

SUMMARY OF THE INVENTION

The present invention has been made under the aforementioned circumstances. The main object of the present invention is to provide a laser treatment apparatus and a laser treatment method to eliminate the above disadvantage possibly caused by connecting a flexible exhaust pipe to a movable cup.

In order to achieve the objective, the present invention provides a laser treatment apparatus, which includes: a substrate holding unit adapted to hold a substrate horizontally, and adapted to rotate the held substrate about an vertical axis by means of a rotating mechanism; a cup surrounding the substrate holding unit and having an exhaust port for exhausting an interior of the cup; a liquid supply nozzle adapted to supply a liquid onto a surface of the substrate held by the substrate holding unit; a laser beam irradiating unit adapted to irradiate the surface of the substrate held by the substrate holding unit with a laser beam; a moving mechanism adapted to horizontally move the substrate holding unit together with the cup, in order to move a irradiated position on the surface of the substrate being irradiated with the laser beam emitted from the laser beam irradiating unit, and to locate the substrate holding unit at a spin-drying position where a liquid existing on the substrate is removed by rotating the substrate; an exhaust unit arranged at a position corresponding a position of the exhaust port when the substrate holding unit is located at the spin-drying position, the exhaust unit being adapted to detachably connect to the exhaust port, and being adapted to suck the interior of the cup when the exhaust unit is connected to the exhaust port; and a controller configured to control the moving mechanism to move the substrate holding unit to the spin-drying position, configured to connect the exhaust unit to the exhaust port, and configured to control the rotating mechanism to rotate the substrate holding unit, when an treatment, which irradiates the surface of the substrate with the laser beam while a liquid film is formed on the substrate by means of the liquid supply nozzle, is completed.

The manners of treatment of a substrate by using a laser beam include; a manner in which the substrate is irradiated with the laser beam while moving the substrate without moving the laser beam; a manner in which the substrate is moved to different positions sequentially, and the substrate is irradiated with the laser beam while the substrate stops moving at each position.

The exhaust unit may be structured such that it includes: an exhaust pipe adapted to detachably connect to the exhaust port when the substrate holding unit is located at the spin-drying position; and a forward-reverse mechanism adapted to move the exhaust pipe toward the exhaust port to connect the exhaust pipe to the exhaust port.

The cup may be structured such that it further has a drain port to discharge a liquid in the cup from the cup. In this case, it is preferable that a tray is arranged below the cup to receive the liquid drained from the drain port, and the tray is shaped and sized so that the tray is capable of receiving the liquid drained from the drain port located at any position to which the drain port is capable of moving. Alternatively, the laser treatment apparatus may be structured such that the drain port is closed by a cap during the laser treatment, and that the drain port is connected to a drainage discharge unit arranged at a position corresponding to the spin-drying position with the cap being opened, during the spin-drying.

The drain port and the exhaust port are not limited to be separated ones, and a single port may be used as the drain port and the exhaust port. In this case, it is preferable that the drainage tray is arranged below the commonly-used port, to which the exhaust unit is connected during the spin-drying of the substrate. Also in this case, as a considerably large amount of a liquid is sucked into the exhaust unit, it is preferable to provide a gas-liquid separating structure in the exhaust unit or at a location downstream of the exhaust unit.

In one embodiment, the moving mechanism includes an X-stage, to which the cup and the substrate holding unit are fixed, adapted to move the cup and the substrate holding unit in X-directions, the X-stage having a hole in which the drain port and the exhaust port are located; and a Y-stage adapted to move the X-stage in Y-directions, and the tray is located below the X-stage.

According to another aspect of the present invention, there is provided a laser treatment method, which includes: making a substrate holding unit hold a substrate horizontally, the substrate holding unit being arranged in a cup having an exhaust port; thereafter, moving the substrate holing unit horizontally, while a surface of the substrate is irradiated with a laser beam with a liquid being supplied to the surface of the substrate, thereby scanning the surface of the substrate by the laser beam; thereafter, moving the substrate holding unit to a position for spin-drying of the substrate; thereafter, connecting an exhaust unit to the exhaust port; and thereafter, rotating the substrate holding unit while an interior of the cup is sucked by the exhaust unit through the exhaust port.

DESCRIPTION OF THE PREFERRED EMBODIMENTS

Figure 1:
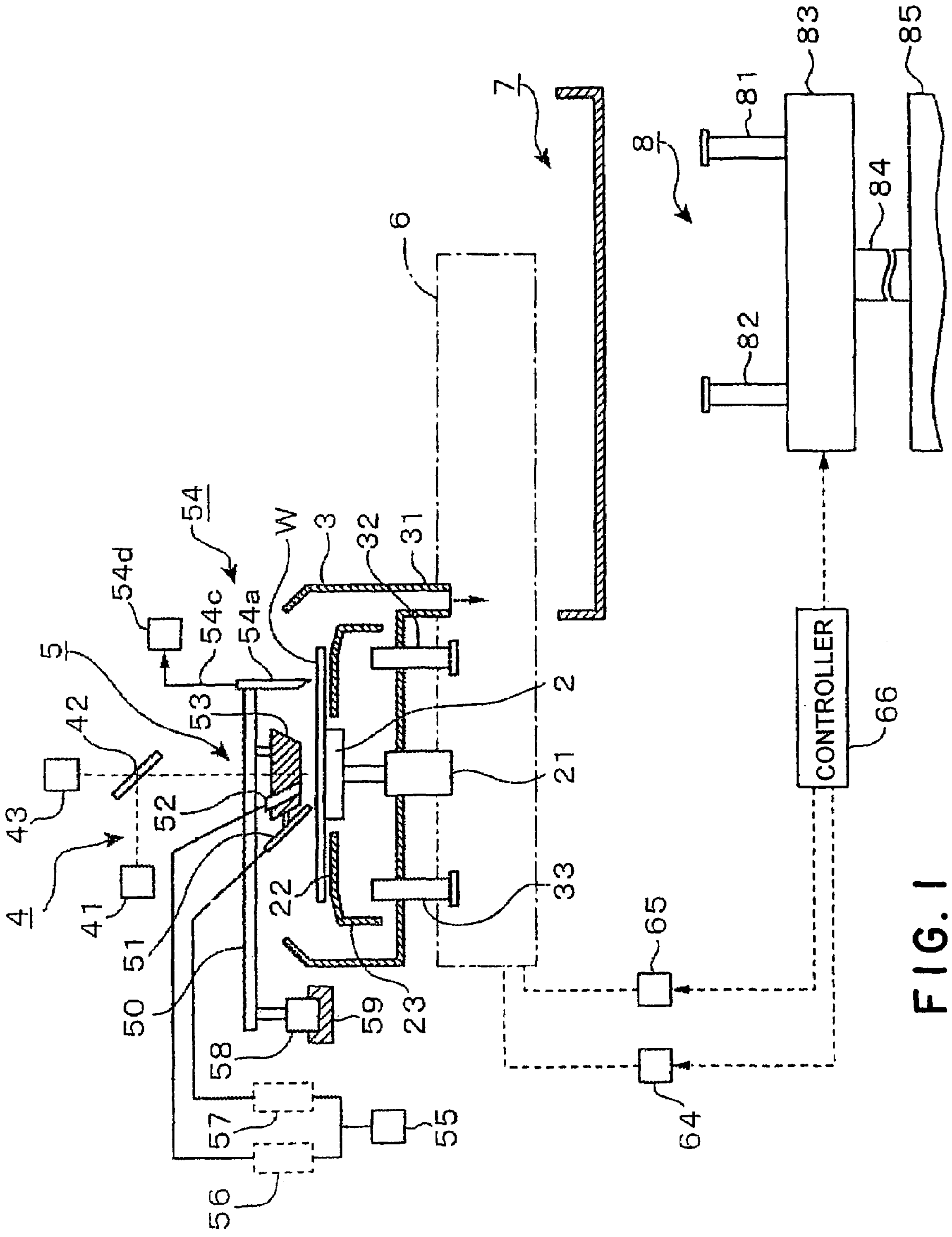
FIG. 1 a vertical cross-sectional view schematically showing the entire structure of a laser treatment apparatus in one embodiment of the present invention.

In FIG. 1 showing the entire structure of a laser treatment apparatus in one embodiment of the present invention, reference sign 2 designates a chuck, serving as a substrate holding unit, which sucks a wafer W (substrate) to hold it horizontally. The chuck 2 is disposed in a cup 3 of a substantially cylindrical shape having an upper opening. The chuck 2 is capable of rotation about a vertical axis and of vertical movement, by means of a driving unit 21 arranged at a bottom center of the cup 3.

Figure 7:
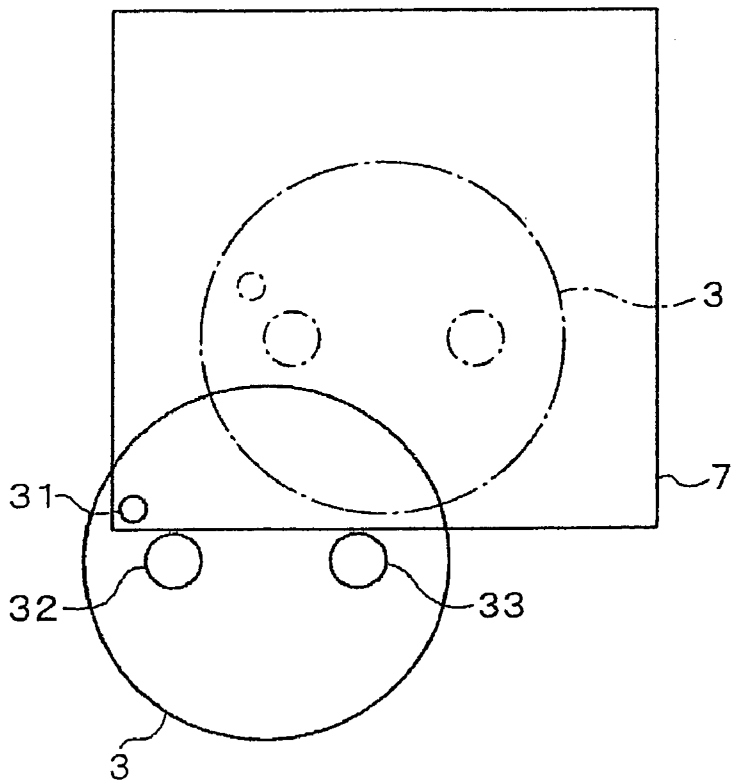
FIG. 7 is a top plan view showing the moving range of the cup in connection with the drainage tray, in the laser treatment apparatus of FIG. 1.

A drain port 31 is provided at a peripheral portion of the bottom of the cup 3 to discharge a liquid e.g., deionized water, spilled from the wafer W, from the cup 3. Exhaust ports 32 and 33 is arranged symmetrically with respect to the center axis of the cup 3 to suck the interior of the cup 3. The respective upper ends of the exhaust ports 32 and 33 project upward from the bottom of the cup 3. As shown in FIG. 7 showing the planer layout of the drain port 31 and the exhaust ports 32 and 33, the distance from the center axis of the cup 3 to each of the exhaust ports 32 and 33 is smaller than the distance from the center axis of the cup 3 to the drain port 31.

A horizontal plate 22 having a ring shape surrounding the chuck 2 is arranged just below the wafer W held by the chuck 2. The outer periphery of the horizontal plate 22 is bent downward to form a cylindrical part 23. The cylindrical part 23 is arranged in such a manner that it separates a space facing the drain port 31 from a space facing the exhaust ports 32 and 33. The lower end of the cylindrical part 23 is slightly removed upward away from the bottom of the cup 3, and is located at a level lower than the levels of the respective upper ends of the exhaust ports 32 and 33, in order to prevent penetration of a liquid (deionized water at the bottom of the cup 3, or fine liquid droplets suspended in the atmosphere in the cup 3) into the exhaust ports 32 and 33 (gas-liquid separating structure).

The laser treatment apparatus is further provided with a laser beam irradiating unit 4 that irradiates a laser beam to perform a predetermined laser treatment, such as dicing, to the wafers, and a liquid film forming unit 5 that forms a liquid film on the wafer W. The laser beam irradiating unit 4 is fixed to a not shown casing serving as an exterior of the laser treatment apparatus. The laser beam irradiating unit 4 comprises a laser beam oscillator 41 that oscillates a laser for machining, such as YAG laser or excimer laser, a half mirror that reflects the laser beam emitted by the laser beam oscillator 41 towards the wafer W surface, a not shown optical device arranged between the half mirror 42 and the wafer W. Arranged above the half mirror 42 is image pickup means such as a CCD camera 43 serving as a position detecting device. The light axis of a laser beam traveling from the half mirror 42 to the surface of the wafer W coincides with the optical axis of the CCD camera 43.

The liquid film forming unit 5 comprises nozzles 51 and 52 that supply a liquid such as deionized water onto the wafer W, a guide member 53 that guides the deionized water flowing on the wafer W to form a liquid film, a liquid collection device 54 that collects the liquid passed through a position on the wafer W irradiated with the laser beam. The guide member 53 is made of a transparent material, preferably, formed of a transparent quartz glass in an inverse circular truncated cone. In the illustrated embodiment, one nozzle 51 is fixed to an outside of the guide member 53, while two nozzles 52, 52 are inserted into the guide member 53 such that the discharge ports thereof are arranged on both side of the discharge port of the nozzle 51. In FIG. 1, only the near-side nozzle 52 can be seen, while the far-side nozzle 52 is behind the near-side nozzle and can not be seen. If the flow rate of a liquid discharged from the center nozzle 51 is large (e.g., 20 m/min) and the flow rate of a liquid discharged from the side nozzles 52, 52 is considerably smaller than that discharged from the center nozzle 51, removed matters, which are removed from the wafer W surface during the laser treatment such as dicing, can be removed from the wafer W surface together with the liquid flow having a high velocity, while preventing the removed matters from spreading across the wafer W surface. In FIG. 1, reference signs 56 and 57 designate supply control systems including valves, flow controllers, pumps, and so on.

Figure 2:
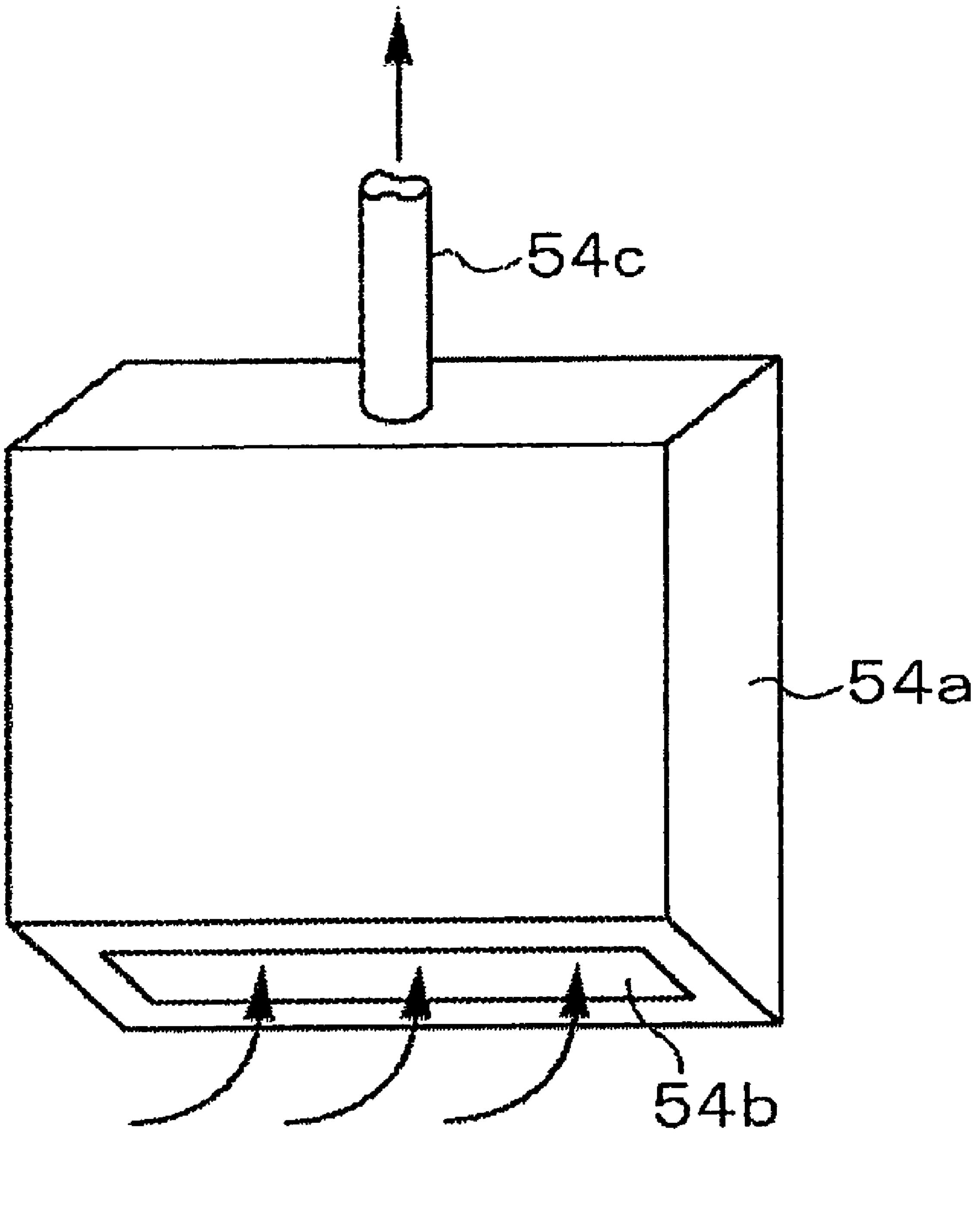
FIG. 2 is a perspective view schematically showing a collecting nozzle shown in FIG. 1.

The liquid collecting unit 54 comprises a collecting nozzle 54*a* (see FIG. 2) of a substantially rectangular shape provided at its tip portion with a sucking port 54*b* for collecting a liquid flow of a band-like shape formed on the wafer W, and a sucking means 54*d* such as ejector that sucks the collecting nozzle 54*a* through a liquid collecting path 54*c*.

The guide member 53 and collecting nozzle 54*a* is fixed to a holding arm 50. An elevating mechanism 58 is connected to the proximal end of the holding arm 50. The elevating mechanism is capable of moving along a rail 59 extending perpendicular to the paper plane of FIG. 1. Thus, the holding arm 50 is capable of move vertically, and of moving in a specific direction (i.e., the direction in which the rail 59 extends.) in a horizontal plane. Note that the structure of the liquid film forming unit 5 is not limited to that described above, and the liquid film forming unit 5 may have various structures, such as a structure disclosed in US 20040197433 A1, the entire disclosure of which is incorporated herein by reference.

The laser treatment apparatus is further provided with: an X-Y stage 6 (shown by chain-dotted lines in FIG. 1), which is a part of the moving mechanism for moving the cup 3 along a horizontal plane; a drainage tray 7 as a drainage receiving device that receives a liquid which is spilled from the wafer W and is discharged from the discharge port 31 of the cup 3; and an exhaust unit 8 to be connected to the exhaust ports 32 and 33. These component parts will be described with reference to FIGS. 3 to 5.

Figure 3:
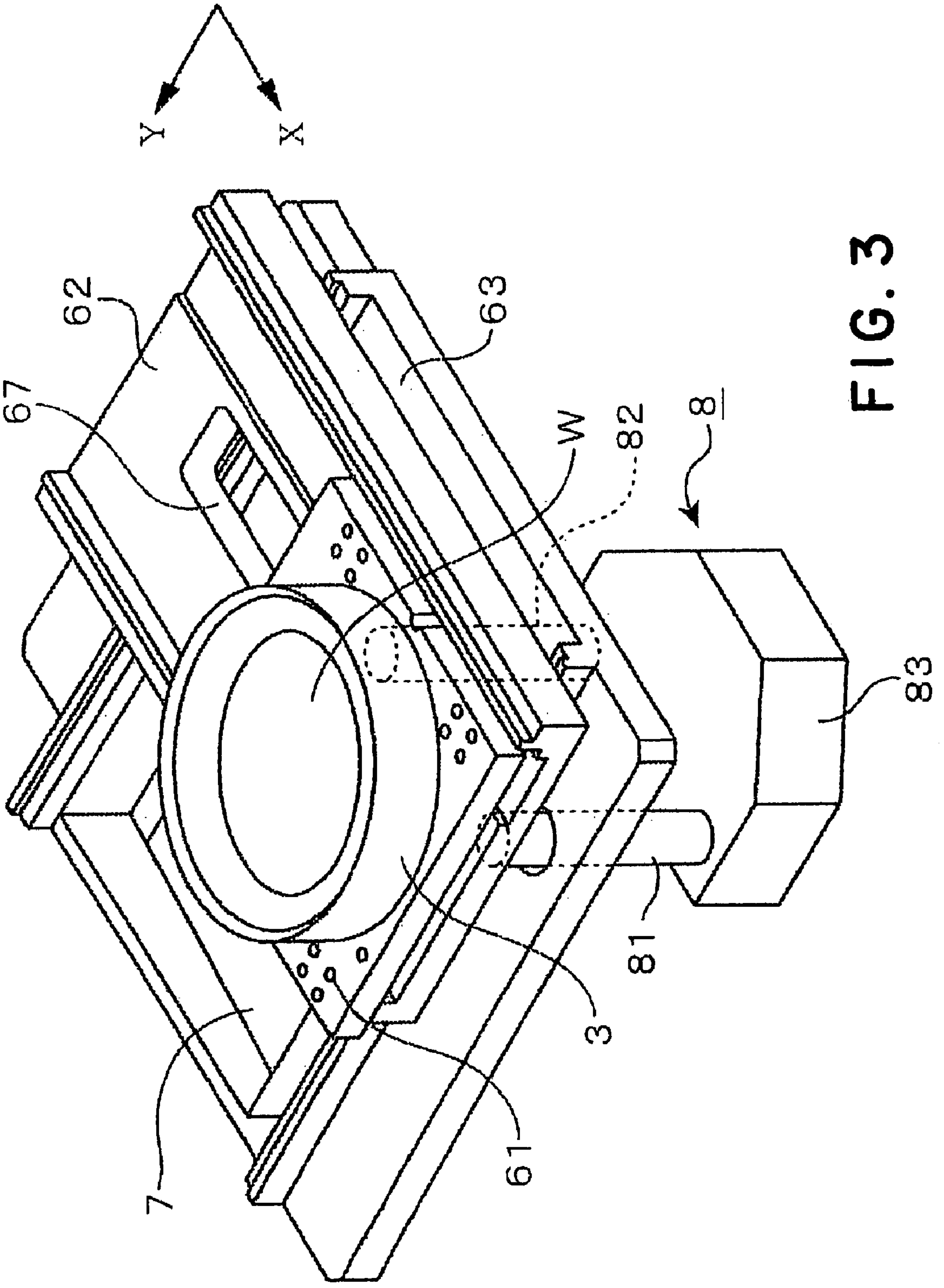
FIG. 3 is a perspective view schematically showing a cup, a moving mechanism (X-Y stage) and an exhaust unit shown in FIG. 1.
Figure 4:
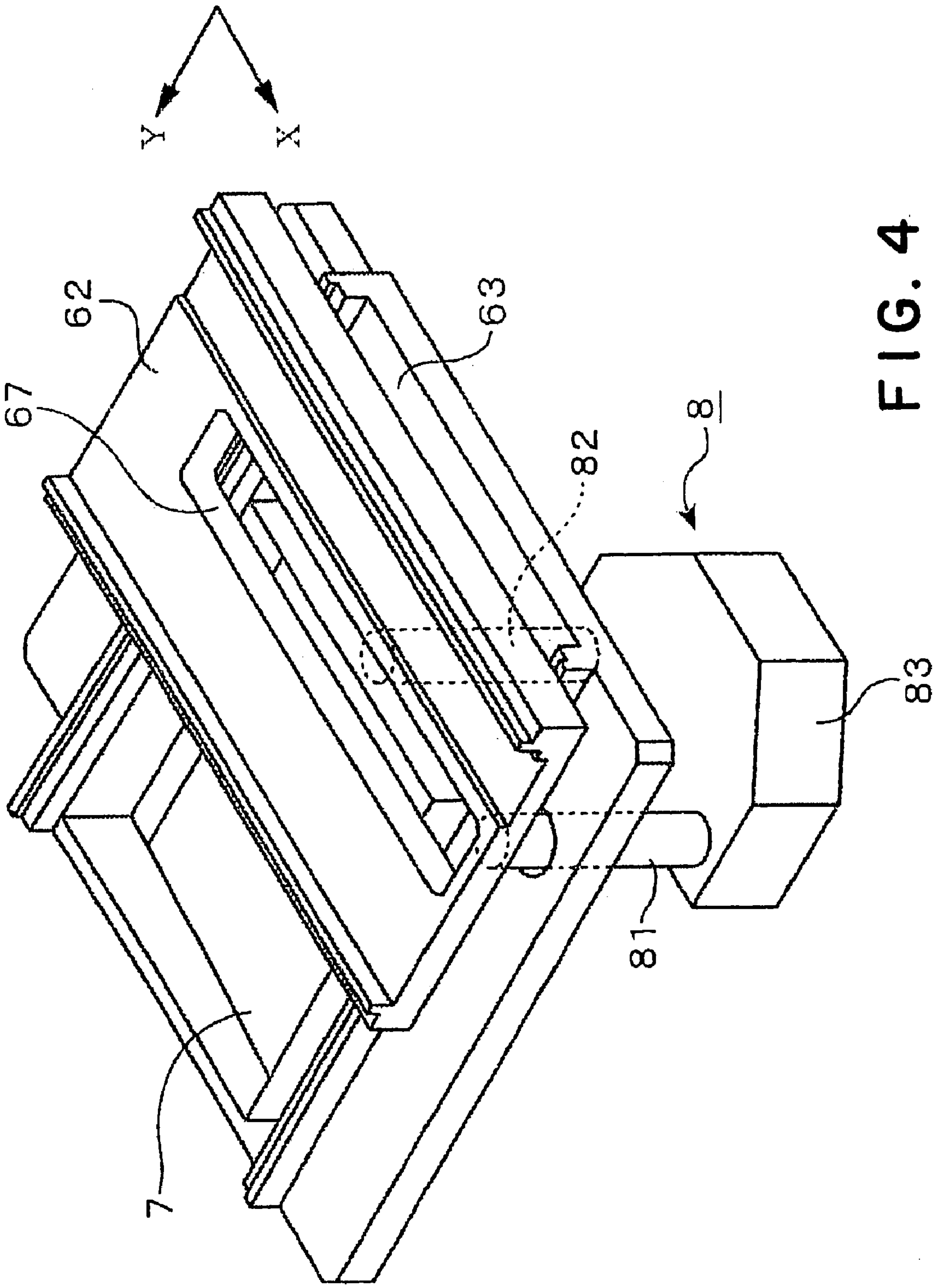
FIG. 4 shows a state in which the cup and an X-stage are removed from the arrangement shown in FIG. 3.

As shown in FIG. 3, the X-Y stage 6 is composed of a stage 61 on which the cup 3 is mounted, and a stage 62 provided with a driving mechanism for moving the stage 61 in X-directions. The stage 62 is configured so that it is capable of moving in Y-directions on a base 63 fixed to the casing (not shown) serving as the aforementioned exterior of the laser treatment apparatus. That is, the stage 61 is an X-stage movable in X-directions, while the stage 62 is a Y-stage movable in Y-directions. The base 63 is provided with a driving mechanism for moving the Y-stage 62 in Y-directions. The driving mechanisms involving the driving of the X-Y stage 6 may be composed of a guide rail, a ball-screw mechanism, a motor, and so on. In FIG. 1, an X-motor 64 arranged on the Y-stage 62 to move the cup 3 in Y-directions and a Y-motor 65 arranged on the base 63 to move the cup 3 in Y-directions are each shown in from of a block. These motors 64 and 65 are controlled by a controller 66.

Although invisible in FIG. 3, through holes (cut-away portions) are formed in the X-stage in positions corresponding to the drain port 31 and the exhaust ports 32 and 33 of the cup 3, respectively. A slit 67 (cut-away portion) extending in X-direction is formed in the Y-stage 62. The slit 67 is shaped and sized such that it contains the entire moving range of the drain port 31 and the exhaust ports 32 and 33 with respect to the Y-stage 62 when the cup 3 moves relative to the Y-stage 62 in X-direction. The drainage tray 7 is shaped and sized such that it contains the entire moving range of the drain port 31 when the cup 3 is moved in X- and Y-directions by means of the X-Y stage 6. Thus, it is ensured that a waste liquid (drainage) spilled from the wafer W surface during laser machining and that scattered from the wafer W during the spin-drying after the laser machining fall down onto the drainage tray 7 via the drain port 31.

Figure 5:
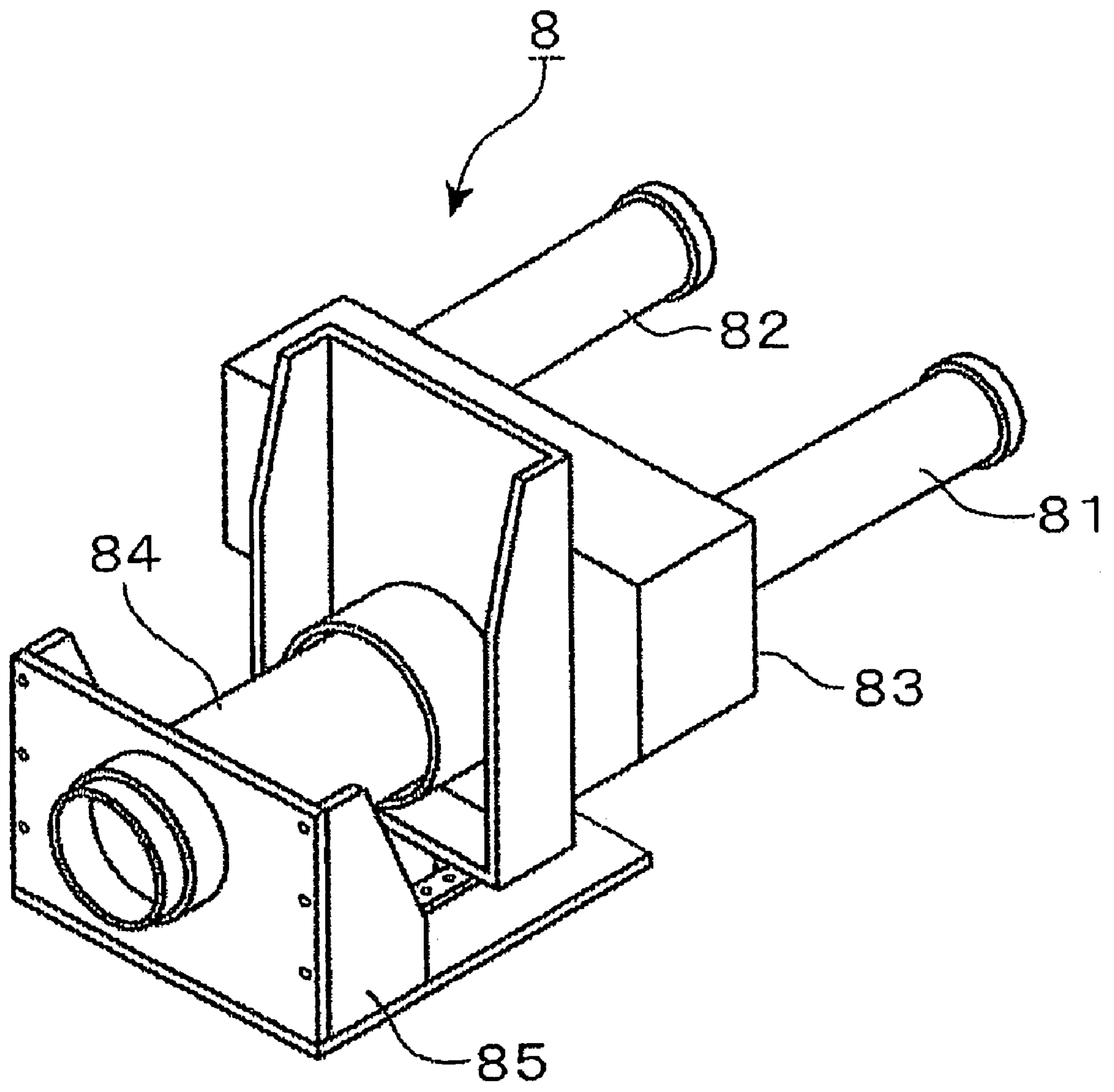
FIG. 5 is a perspective view schematically showing the exhaust unit shown in FIG. 1 while it lies down.

The exhaust unit 8 is secured to the not shown aforementioned casing. As shown in FIG. 5, the exhaust unit includes: exhaust pipes 81 and 82 that are detachably connected to the exhaust ports 32 and 33, respectively; an elevating block 83 connected to the proximal ends of the exhaust pipes 81 and 82 and provided therein with a gas communication chamber; and a fixed block 85 connected to the elevating block 83 through an extendable pipe 84. Note that, in FIG. 5, the exhaust unit 8 lies down, for better understanding of the structure thereof. The elevating block 83 moves up and down in response to a control signal sent from the controller 66. At this time, the extendable pipe 84 expands or contracts. The extendable pipe 84 may be of a telescopic structure having a pipe on the elevating block 83 and a pipe on the fixed block 84 with the one being fitted into the other, so that the pipe 84 is configured to be extendable. The proximal end of the extendable pipe 84 is connected to suctioning means such as a suction pump.

The exhaust pipes 81 and 82, which are arranged in correspondence to the exhaust ports 32 and 33, respectively, are connected and disconnected to and from exhaust the pipes 81 and 82 according to the vertical movement of the elevating block 83. Flanges are formed at the upper ends of the exhaust pipes 81 and 82 and the lower ends of the exhaust ports 32 and 33, respectively. When the exhaust pipes 81 and 82 and the exhaust ports 32 and 33 are connected, respectively, the corresponding flanges are connected in airtight fashion via O-rings made of a resin sealing material.

As will be understood from the positions of the exhaust pipes 81 and 82, as viewed from the above, the exhaust unit 8 is arranged in an area outside the drainage tray 7, and thus the connections of the exhaust pipes 81 and 82 and the exhaust ports 32 and 33 are formed in the area outside the drainage tray 7. The positions where the connections are formed correspond to the position to which the cup 3 is moved when spin-drying of the wafer W is performed.

The operation of the laser treatment apparatus will be described taking an example in which a wafer W, on which integrated circuits have been already formed, is subjected to a dicing. First, the wafer W is transferred from a not shown transfer arm to the chuck 2 in the cup 3 located in its transfer position. Specifically, the transfer arm places the wafer W on the raised chuck 3, and thereafter, the chuck 3 is lowered. Then, the cup 3 is moved by means of the X-Y stage 6 so that the starting point of the dicing is positioned on the optical axis of the laser beam irradiating unit 4. At this time, an orientation flat or a notch of the wafer W is detected by using the CCD camera 43, and the positioning of the wafer W is carried out based on the detection result.

Figure 6:
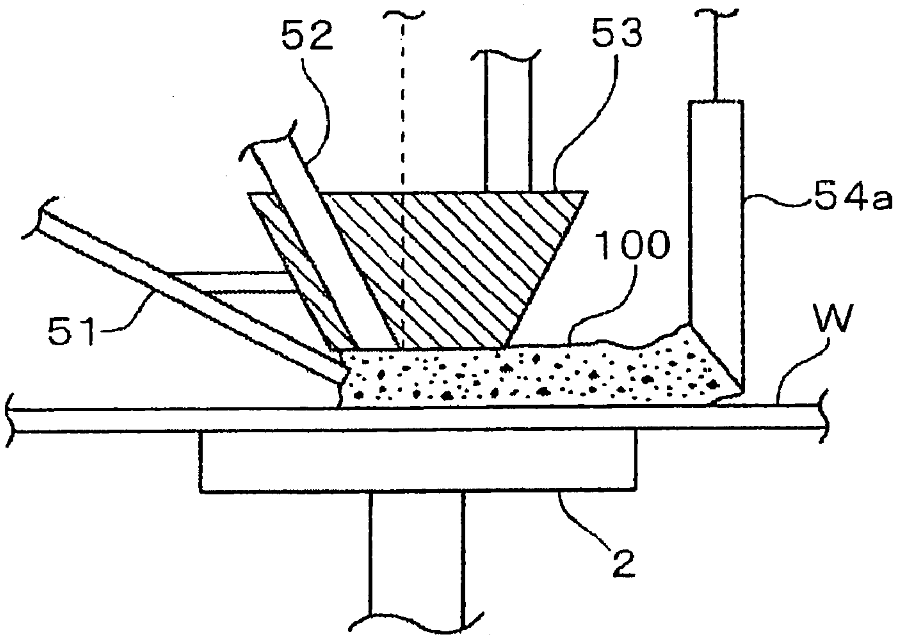
FIG. 6 is an explanatory drawing showing a state in which a laser treatment is being performed by using the laser treatment apparatus of FIG. 1.

Then, the holding arm 50 is moved so that the liquid supply nozzle 51, 52, the guide member 53 and the collecting nozzle 54*a* are moved from their waiting area to respective predetermined positions near the wafer W. The distance between the lower surface of the guide member 53 and the front surface of the wafer W is set to be about 2 mm. Thereafter, a liquid, in this embodiment, deionized water, is discharged from the liquid supply nozzles 51 and 52. Thereby, a deionized-water flow 100 (liquid flow) is formed below the guide member 53, as shown in FIG. 6. At this time, the deionized water passed through the space below the guide member 53 is collected by the collecting nozzle 54*a* upon operation of the sucking means 54*d* of the liquid collecting unit 54. In this way, with a liquid film of deionized water being formed on the wafer W, the surface of the wafer W is scanned by a laser beam in a predetermined scanning pattern, such as a lattice-like scanning pattern, by moving the chuck 2 in X- or Y-directions by means of the X-Y stage 6 while the surface of the wafer W is irradiated with a laser beam, transmitted through the guide member 53, by means of the laser beam irradiating unit 4. As a result, the surface of the wafer W is ground by the laser beam, in other words, the wafer W is half-cut, to form dicing lines. In the post process, the wafer W is cut along the dicing lines from the back surface thereof to be in individual chips.

The wafer shavings produced by the laser-beam cutting flow together with the deionized-water flow, and collected by the collecting nozzle 54*d*. Although the most part of the deionized-water supplied from the liquid supply nozzles 51 and 52 is collected by the collecting nozzle 54*a*, non-collected deionized-water falls into the cup 3. If the position irradiated with the laser beam is near the periphery of the wafer W, a large amount of deionized-water falls into the cup 3. The deionized-water fallen into the cup 3 is discharged therefrom through the drain port 31. As the drainage tray 7 covers the moving range of the drain port 31 in which the drain port 31 is moved by the X-Y stage 6 during the laser beam treatment, it is ensured that the drainage discharged from the drain port 31 is received by the drainage tray 7.

Figure 8:
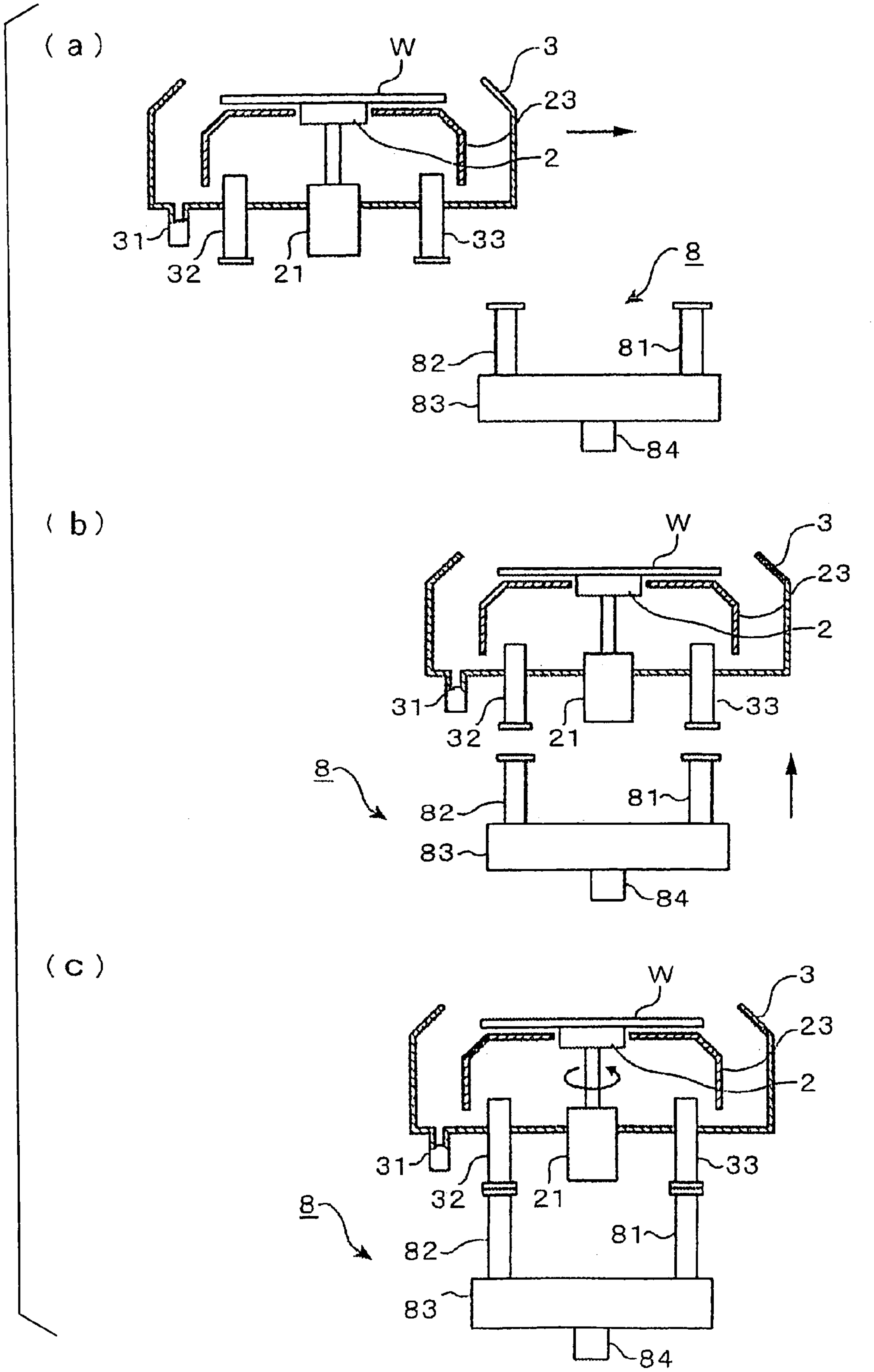
FIG. 8 is an explanatory drawing showing a step of connecting the exhaust unit to the cup, in the laser treatment apparatus of FIG. 1.

After completion of the dicing-line formation by using the laser beam, the cup 3 is moved to its spin-drying position by the X-Y stage 6, as shown in FIG. 8(*a*). FIG. 7 is a schematic plan view showing the positional relationship between the cup 3 and the drainage tray 7, and shows the cup 3 in its spin-drying position by solid lines. As is apparent from FIG. 7, the drain port 31 is within the range of the drainage tray 7; and the exhaust ports 32 and 33 are outside the drainage tray 7. At this time, the exhaust ports 32 and 33 are positioned right above the exhaust ports 81 and 82, respectively, as shown in FIG. 8(*b*).

Next, as indicated by an arrow in FIG. 8(*b*), the elevating block 83 of the exhaust unit 8 raises together with the exhaust pipes 81 and 82, and they are respectively connected, in an airtight fashion, to the exhaust ports 32 and 33 of the cup 3 via O-rings, as previously mentioned. Next, as indicated by an arrow in FIG. 8(*c*), the chuck 3 is rotated at a high speed to scatter deionized water remaining on the wafer W, thereby to dry the wafer W. At this time, as the exhaust ports 32 and 33 is sucked by the exhaust unit 8, liquid droplets scattered from the wafer W are drawn into the lower space of the cup 3, and thus will never scattered out of the cup 3 in the laser treatment apparatus. The liquid droplets fallen into the cup 3 flows through the drain port 31 and run down to the drainage tray 9 therebelow. After the completion of the series of the process steps as previously mentioned, the cup 3 is returned to its transfer position, the chuck 2 is raised to transfer the wafer W to the not shown transfer arm. The aforementioned series of operations (e.g., the movement of the cup 3 in X- and Y-directions during laser treatment; the connection of the exhaust unit 8 and the exhaust ports 32, 33; the high-speed rotation of the chuck 2 in the spin-drying) are performed according to a program stored in a memory of the controller 66.

In the aforementioned embodiment, when the laser dicing is performed while the surface of the wafer W is supplied with the liquid, the exhaust ports 32 and 33 of the cup 3 are separated from the exhaust unit 8 (exhaust pipes 81, 82); and when the spin-drying is performed after the laser treatment, the exhaust unit 8 is connected to the exhaust ports 32 and 33 of the cup 3 moved to its spin-drying position. Thus, the driving mechanism of the cup 3 is not subjected to a load, which the driving mechanism of the cup 3 may bear when a flexible exhaust pipe such as a bellows-like hose is always connected to the cup 3. Therefore, even if a driving source has a small output power, the wafer W can be moved at a high speed and a high acceleration. The space on a flexible exhaust pipe may be saved, resulting in downsizing of the laser treatment apparatus.

In the aforementioned embodiment, the drain port 31 for discharging a liquid fallen into the cup 3 is arranged separately from the exhaust ports 32 and 33, and the drainage tray 7, which covers the moving range of the drain port 31, is arranged below the cup 3. Thus, the drainage fallen into the cup 3 during the dicing process is securely collected. It is not necessary to connect a flexible exhaust pipe to the drain port 31.

As the exhaust pipes 81 and 82 of the exhaust unit 8 are arranged in an area outside the drainage tray 7, in other words, in an area outside the moving range of the exhaust port 31, the drainage does not penetrate the interior of the exhaust pipes 81 and 82, and thus the provision of a gas-liquid separating structure in the exhaust unit 8 is not necessary.

The present invention is not limited to the aforementioned embodiment, and various modifications are possible.

Figure 9:
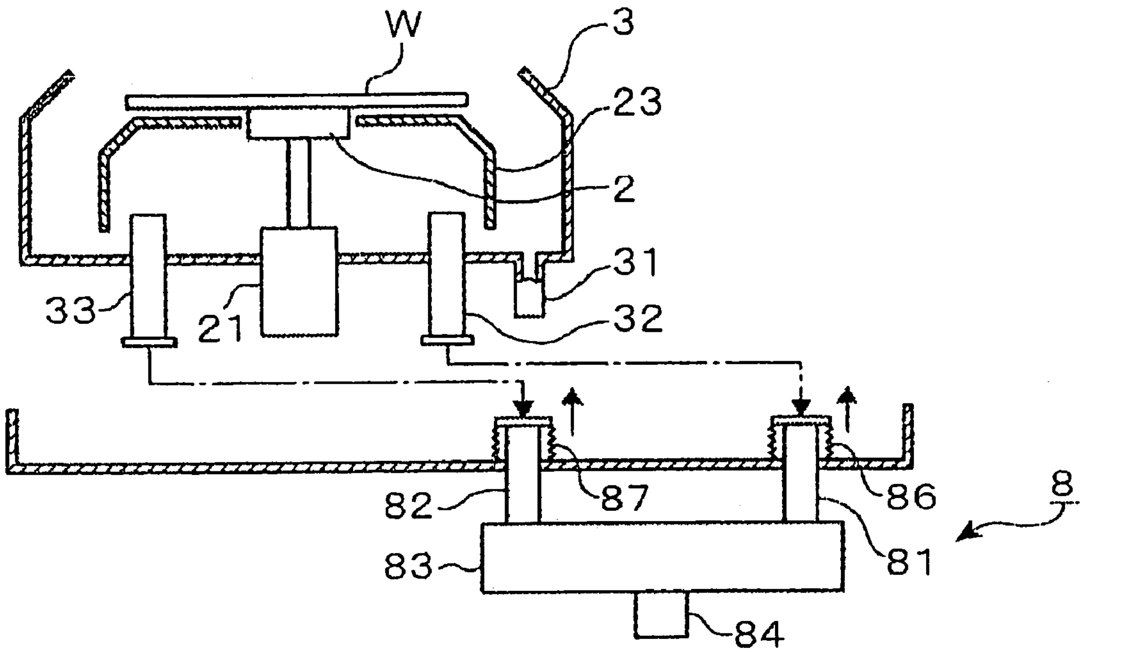
FIG. 9 is a vertical cross-sectional view schematically showing another embodiment of the laser treatment apparatus according to the present invention.

In one modification, the exhaust unit 8 may be arranged within an area of the drainage tray 7 as shown in FIG. 9, instead of arranging it in the area outside the drainage tray 7. In this case, the exhaust ports 81 and 82 extend through the drainage tray 7, and bellows 86 and 87 for waterproofing are arranged around the exhaust pipes 81 and 82, respectively. In the arrangement of FIG. 9, as it is possible that a drainage discharged from the drain port 31 comes into the exhaust pipes 81 and 82, it is preferable to provide a gas-liquid separating structure in the exhaust unit 8 or at a location downstream of the exhaust unit 8.

Figure 10:
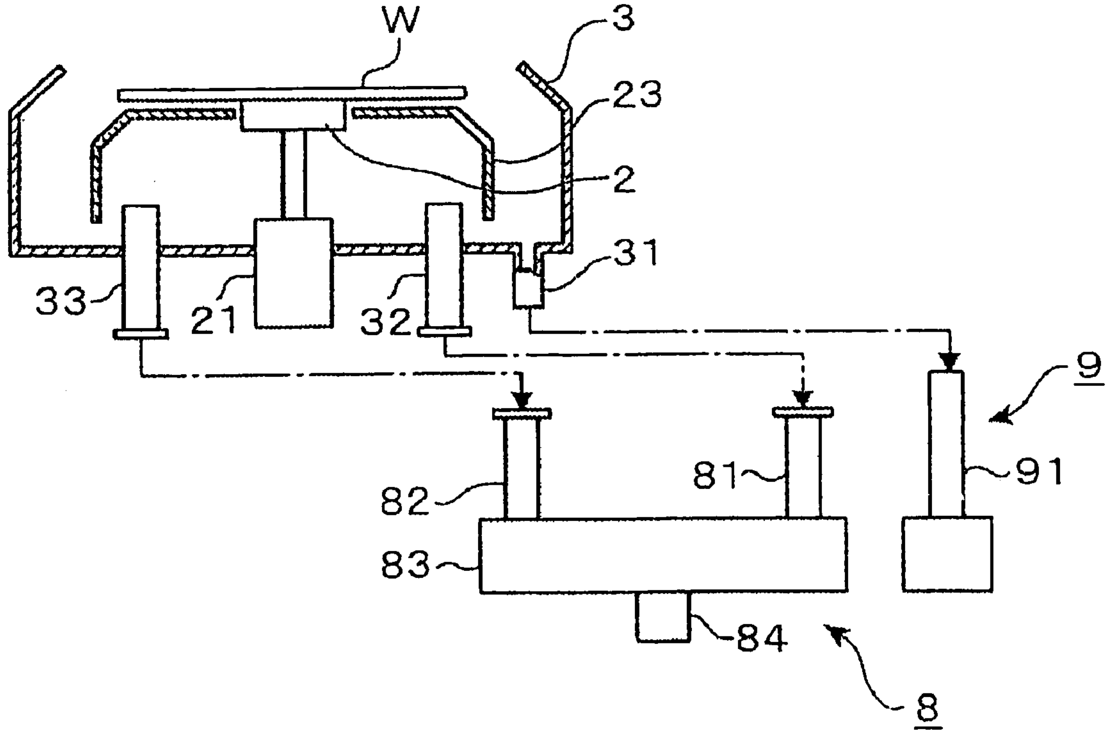
FIG. 10 is a vertical cross-sectional view schematically showing another embodiment of the laser treatment apparatus according to the present invention.
Figure 11:
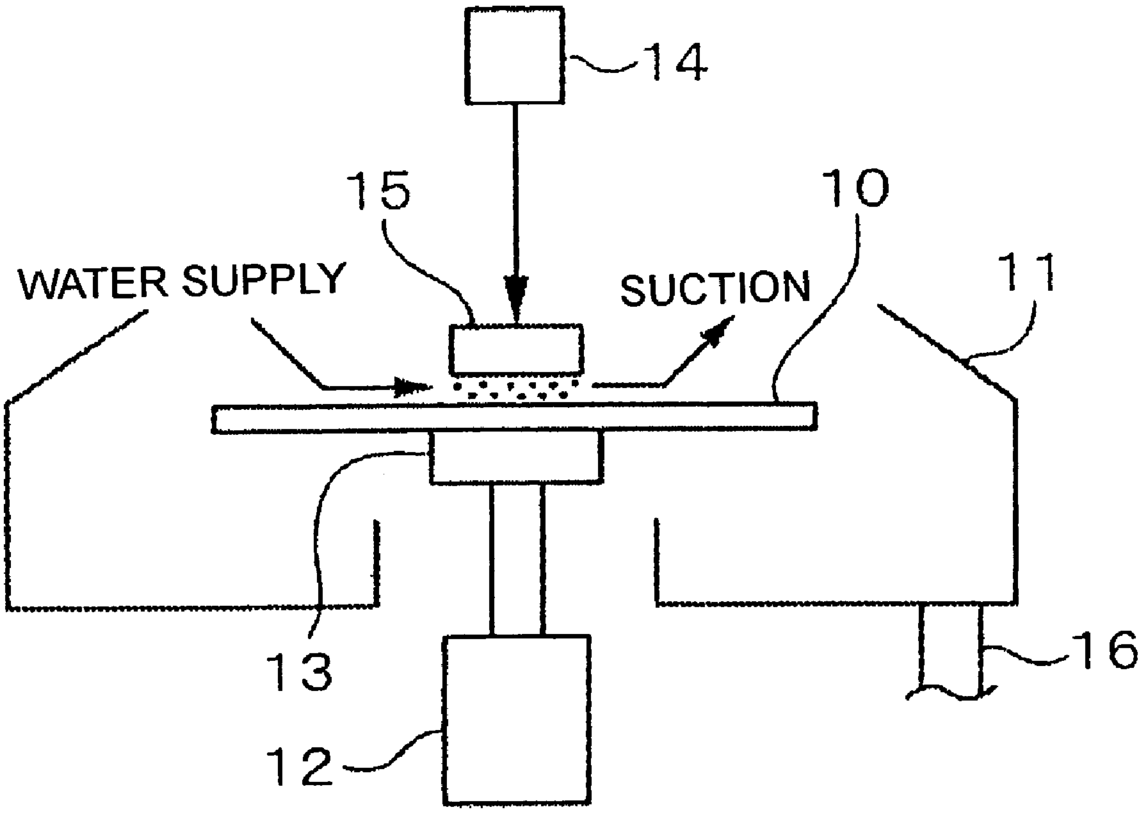
FIG. 11 is a vertical cross-sectional view schematically showing the structure of a conventional laser treatment apparatus.

In another modification, as shown in FIG. 10, a drainage discharging unit 9, which can be connected to the drain port 31 when the cup 3 is in its spin-drying position, may be provided instead of the drainage tray 7. The drainage discharging unit 9 is fixed to the aforementioned casing, and includes a drain pipe 91, which is capable of being connected to the drain port 31 and of moving vertically. In this case, it is preferable to provide a connecting structure in which: the drain port 31 is provided with a cap which is spring-biased to close the drain port 31 in usual; and the cap is opened against the spring-biasing force when the drain pipe 91 is connected to the drain port 31 to push the cap upward, thereby the drain port 31 and drain pipe 91 communicate with each other. Alternatively, there may be provided a structure in which; the drain port 31 is provided with a cap which opens and closes by means of an actuator; and the cap is opened when the drain port 31 is connected to the drain pipe 91 according to a control signal transmitted from an external device in wired or wireless transmission.

In another modification, one or more exhaust ports may be utilized as a drain port, the drainage tray may be arranged below the exhaust port(s) utilized as a drain port, to which the exhaust unit may be connected during the spin-drying. In this case, it is preferable to provide a gas-liquid separating structure in the exhaust unit or at a location downstream of the exhaust unit.

What is claimed is:

1. A laser treatment apparatus comprising:

a substrate holding unit configured to hold a substrate horizontally, and configured to rotate the held substrate about a vertical axis by means of a rotating mechanism;

a cup surrounding the substrate holding unit and connected to the substrate holding unit to move together with the substrate holding unit, the cup having an exhaust port having an open end for exhausting an interior of the cup;

a liquid supply nozzle configured to supply a liquid onto a surface of the substrate held by the substrate holding unit;

a laser beam irradiating unit configured to irradiate the surface of the substrate held by the substrate holding unit with a laser beam;

a moving mechanism configured to horizontally move the substrate holding unit and the cup within a laser treatment area, in order to move an irradiated position on the surface of the substrate being irradiated with the laser beam emitted from the laser beam irradiating unit, and configured to locate the substrate holding unit and the cup at a spin-drying position where a liquid existing on the substrate is removed by rotating the substrate;

an exhaust unit arranged at a position corresponding to a position of the exhaust port when the substrate holding unit and the cup are located at the spin-drying position, the exhaust unit configured to detachably connect to the open end of the exhaust port, and the exhaust unit being configured to suck the interior of the cup when the exhaust unit is connected to the exhaust port, wherein the exhaust unit is disposed such that the open end of the exhaust unit is apart from the open end of the exhaust port of the cup when the substrate holding unit and the cup are located within the laser treatment area;

a controller configured to control the moving mechanism to move the substrate holding unit and the cup within the laser treatment area to perform a laser treatment that irradiates the surface of the substrate with the laser beam emitted from the laser beam irradiating unit while a liquid film is formed on the substrate by means of the liquid supply nozzle, and also configured to move the substrate holding unit and the cup to the spin-drying position, connect the open end of the exhaust to the open end of the exhaust port, and control the rotating mechanism to rotate the substrate holding unit, when the laser treatment is completed; wherein the exhaust unit includes an exhaust pipe including the open end of the exhaust unit; and a forward-reverse mechanism configured to move the exhaust pipe toward the exhaust port of the cup located at the spin-drying position to connect the open end of the exhaust pipe to the open end of the exhaust port; and wherein the controller is configured to drive the forward-reverse mechanism to connect the open end of the exhaust pipe to the open end of the exhaust port when the substrate holding unit and the cup are in the spin-drying position.

2. A laser treatment apparatus comprising:

a substrate holding unit configured to hold a substrate horizontally, and configured to rotate the held substrate about a vertical axis by means of a rotating mechanism;

a cup surrounding the substrate holding unit and having an exhaust port for exhausting an interior of the cup;

a liquid supply nozzle configured to supply a liquid onto a surface of the substrate held by the substrate holding unit;

a laser beam irradiating unit configured to irradiate the surface of the substrate held by the substrate holding unit with a laser beam;

a moving mechanism configured to horizontally move the substrate holding unit together with the cup, in order to move an irradiated position on the surface of the substrate being irradiated with the laser beam emitted from the laser beam irradiating unit, and to locate the substrate holding unit at a spin-drying position where a liquid existing on the substrate is removed by rotating the substrate;

an exhaust unit arranged at a position corresponding a position of the exhaust port when the substrate holding unit is located at the spin-drying position, the exhaust unit being configured to detachably connect to the exhaust port, and being configured to suck the interior of the cup when the exhaust unit is connected to the exhaust port; and a controller configured to control the moving mechanism to move the substrate holding unit to the spin-drying position, configured to connect the exhaust unit to the exhaust port, and configured to control the rotating mechanism to rotate the substrate holding unit, when a treatment, which irradiates the surface of the substrate with the laser beam while a liquid film is formed on the substrate by means of the liquid supply nozzle, is completed, wherein the cup has a drain port to discharge a liquid in the cup from the cup, and wherein a tray is arranged below the cup to receive the liquid drained from the drain port, and the tray is shaped and sized so that the tray is capable of receiving the liquid drained from the drain port located at any position to which the drain port is capable of moving.

3. The laser treatment apparatus according to claim 2, wherein an end of the exhaust pipe to be connected to the exhaust port is located at a position outside the tray as viewed from above.

4. The laser treatment apparatus according to claim 2, wherein the moving mechanism includes:

an X-stage, to which the cup and the substrate holding unit are fixed, adapted to move the cup and the substrate holding unit in X-directions, the X-stage having a hole in which the drain port and the exhaust port are located; and a Y-stage configured to move the X-stage in Y-directions, wherein the tray is located below the X-stage.

* * * * *